(12) United States Patent
Lin

(10) Patent No.: US 9,984,995 B1
(45) Date of Patent: May 29, 2018

(54) SEMICONDUCTOR PACKAGE AND MANUFACTURING METHOD THEREOF

(71) Applicant: NANYA TECHNOLOGY CORPORATION, Taoyuan (TW)

(72) Inventor: Po-Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days. days.

(21) Appl. No.: 15/350,099

(22) Filed: Nov. 13, 2016

(51) Int. Cl.
*H01L 25/065* (2006.01)
*H01L 23/498* (2006.01)
*H01L 23/538* (2006.01)
*H01L 23/48* (2006.01)
*H01L 23/00* (2006.01)
*H01L 25/00* (2006.01)

(52) U.S. Cl.
CPC ........ *H01L 25/0652* (2013.01); *H01L 23/481* (2013.01); *H01L 23/49816* (2013.01); *H01L 23/49827* (2013.01); *H01L 23/49833* (2013.01); *H01L 23/5383* (2013.01); *H01L 23/5385* (2013.01); *H01L 24/16* (2013.01); *H01L 24/17* (2013.01); *H01L 24/48* (2013.01); *H01L 24/73* (2013.01); *H01L 25/0655* (2013.01); *H01L 25/50* (2013.01); *H01L 2224/16225* (2013.01); *H01L 2224/17181* (2013.01); *H01L 2224/4824* (2013.01); *H01L 2224/73207* (2013.01); *H01L 2224/73257* (2013.01)

(58) Field of Classification Search
USPC ....................................................... 257/621
See application file for complete search history.

(56) References Cited

U.S. PATENT DOCUMENTS

| | | | | |
|---|---|---|---|---|
| 9,508,704 | B2* | 11/2016 | Chung | H01L 21/76898 |
| 9,520,333 | B1* | 12/2016 | Shih | H01L 23/3171 |
| 2010/0148316 | A1 | 6/2010 | Kim et al. | |
| 2012/0074562 | A1* | 3/2012 | Yu | H01L 23/147 |
| | | | | 257/737 |
| 2012/0273782 | A1* | 11/2012 | Goel | H01L 22/32 |
| | | | | 257/48 |
| 2013/0187292 | A1* | 7/2013 | Semmelmeyer | H01L 25/0652 |
| | | | | 257/777 |
| 2014/0070380 | A1 | 3/2014 | Chiu et al. | |
| 2015/0318261 | A1* | 11/2015 | Chung | H01L 21/76898 |
| | | | | 257/774 |
| 2016/0260695 | A1* | 9/2016 | Chung | H01L 21/565 |

FOREIGN PATENT DOCUMENTS

| TW | 201306211 A | 2/2013 |
|---|---|---|
| TW | 201324730 A | 6/2013 |
| TW | 201523833 A | 6/2015 |
| TW | 201533882 A | 9/2015 |
| TW | 201611213 A | 3/2016 |

\* cited by examiner

Primary Examiner — Marcos D Pizarro
Assistant Examiner — Lawrence Tynes, Jr.
(74) *Attorney, Agent, or Firm* — CKC & Partners Co., Ltd.

(57) ABSTRACT

A semiconductor package includes a package substrate, a first semiconductor chip, a second semiconductor chip, and a top interposer. The first semiconductor chip and the second semiconductor chip are disposed on the package substrate. The top interposer is electrically connected to the first semiconductor chip and the second semiconductor chip, and the first semiconductor chip and the second semiconductor chip are present between the package substrate and the top interposer.

20 Claims, 11 Drawing Sheets

SEMICONDUCTOR PACKAGE AND MANUFACTURING METHOD THEREOF

BACKGROUND

Field of Disclosure

The present disclosure relates to a semiconductor package.

Description of Related Art

Integrated circuit (IC) product technology incorporates a number of heterogeneous functions such as central processing unit (CPU) logic, graphics functions, cache memory and other system functions to create integrated system-on-chip (SOC) or system-in-chip (SIC) designs. The SOC/SIC designs may lower product design complexity and number of components for each product. ICs are miniature devices with tiny contact pads that are connected to other IC or non-IC components. The connection to other components is facilitated by substrates such as printed circuit boards (PCBs). However, products may have required a system board using separate packages for the different functions, which may increase a system board area, power loss, and cost of an integrated solution.

SUMMARY

An aspect of the present disclosure is to provide a semiconductor package including a package substrate, a first semiconductor chip, a second semiconductor chip, and a top interposer. The first semiconductor chip and the second semiconductor chip are disposed on the package substrate. The top interposer is electrically connected to the first semiconductor chip and the second semiconductor chip, and the first semiconductor chip and the second semiconductor chip are present between the package substrate and the top interposer.

In some embodiments, the semiconductor package further includes at least one connection element disposed between the first semiconductor chip and the package substrate to interconnect the first semiconductor chip and the package substrate.

In some embodiments, a gap is present between the first semiconductor chip and the second semiconductor chip, and the gap is at least partially disposed between the top interposer and the package substrate.

In some embodiments, the top interposer comprises a core and at least one first trace layer. The core has a first surface and a second surface opposite to the first surface. The first surface faces the package substrate. The first trace layer is disposed on the first surface. The first trace layer interconnects the first semiconductor chip and the second semiconductor chip.

In some embodiments, the top interposer further includes a second trace layer disposed on the second surface.

In some embodiments, the second trace layer is electrically connected to the first semiconductor chip.

In some embodiments, the semiconductor package further includes a third semiconductor chip disposed on the top interposer.

In some embodiments, the third semiconductor chip is electrically connected to the top interposer.

In some embodiments, the semiconductor package further includes a fourth semiconductor chip disposed between the third semiconductor chip and the top interposer. The fourth semiconductor chip includes a via therein to interconnect the third semiconductor chip and the top interposer.

In some embodiments, the top interposer includes a via therein to interconnect the first semiconductor chip and the third semiconductor chip.

In some embodiments, the semiconductor package further includes a fourth semiconductor chip electrically connected to the third semiconductor chip. The third semiconductor chip is disposed between the fourth semiconductor chip and the top interposer.

In some embodiments, the semiconductor package further includes a third semiconductor chip disposed between the first semiconductor chip and the package substrate.

In some embodiments, the semiconductor package further includes a bottom interposer disposed between the first semiconductor chip and the package substrate.

In some embodiments, the bottom interposer is electrically connected to the first semiconductor chip and the second semiconductor chip.

In some embodiments, the bottom interposer comprises a via therein to interconnect the first semiconductor chip and the package substrate.

Another aspect of the present disclosure is to provide a method for manufacturing a semiconductor package including disposing a first semiconductor chip and a second semiconductor chip on a package substrate. The first semiconductor chip and the second semiconductor chip are adhered. A top interposer is disposed on the first semiconductor chip and the second semiconductor chip to interconnect the first semiconductor chip and the second semiconductor chip. The first semiconductor chip and the second semiconductor chip are disposed between the top interposer and the package substrate.

In some embodiments, the method further includes disposing a bottom interposer on the package substrate. The first semiconductor chip and the second semiconductor chip are disposed on the bottom interposer and are disposed between the top interposer and the bottom interposer.

In some embodiments, the method further includes disposing a third semiconductor chip on the top interposer.

Another aspect of the present disclosure is to provide a method for manufacturing a semiconductor package including disposing a first semiconductor chip and a second semiconductor chip on a top interposer. The first semiconductor chip and the second semiconductor chip are adhered. A package substrate is disposed to the first semiconductor chip and the second semiconductor chip. The first semiconductor chip and the second semiconductor chip are present between the package substrate and the top interposer.

In some embodiments, the method further includes disposing a bottom interposer on the first semiconductor chip and the second semiconductor chip. The first semiconductor chip and the second semiconductor chip are disposed between the bottom interposer and the top interposer.

DETAILED DESCRIPTION

Figure 1:
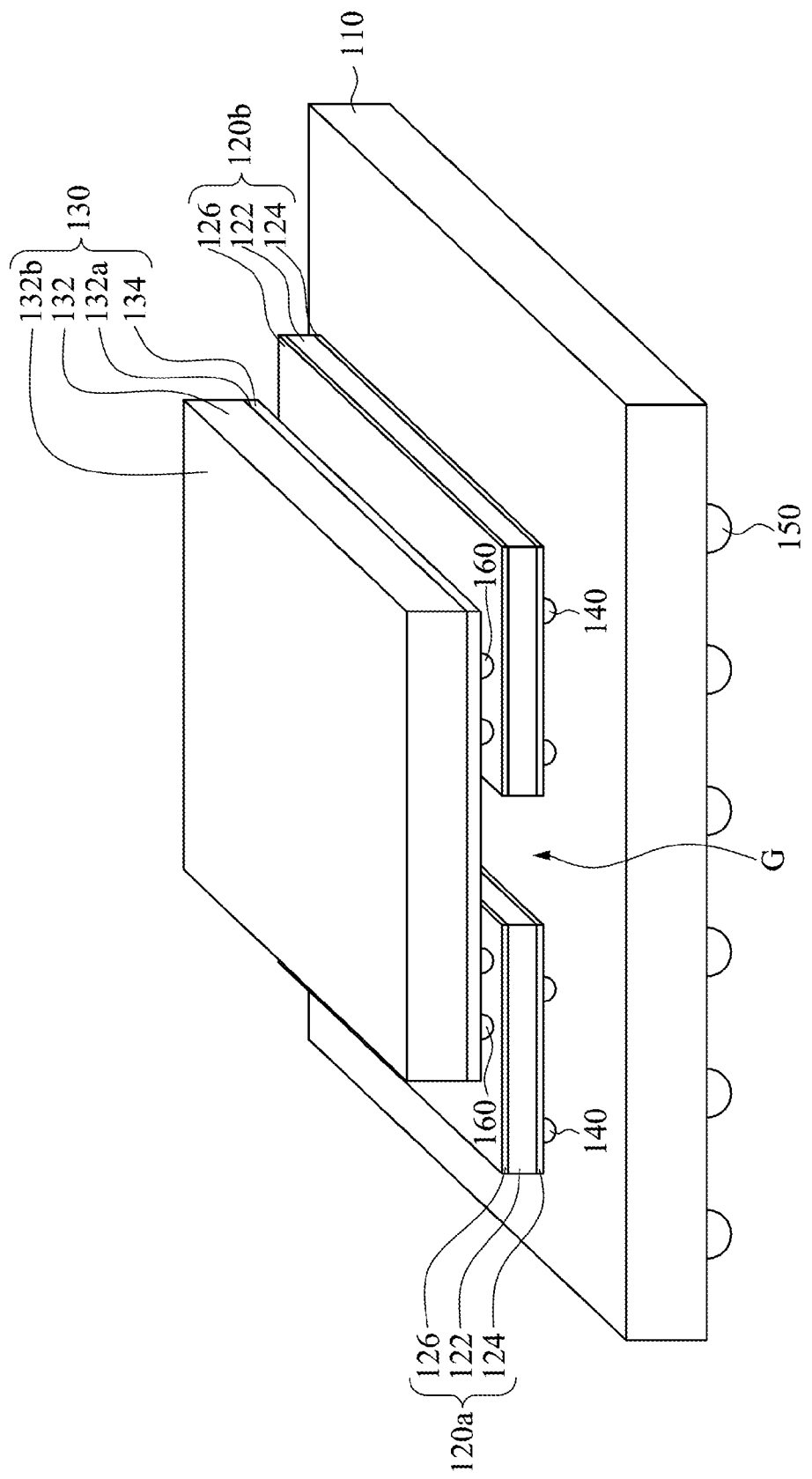
FIG. 1 is a perspective view of a semiconductor package according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
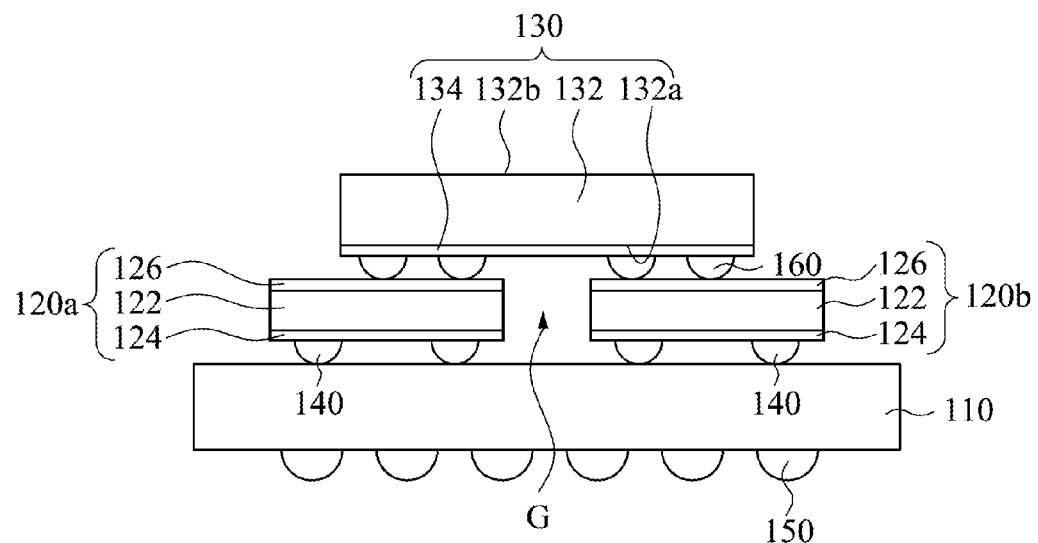
FIG. 2 is a side view of the semiconductor package of FIG. 1.

FIG. 1 is a perspective view of a semiconductor package according to some embodiments of the present disclosure, and FIG. 2 is a side view of the semiconductor package of FIG. 1. The semiconductor package includes a package substrate 110, a plurality of semiconductor chips, and a top interposer 130. For example, in FIG. 1, the semiconductor package includes two semiconductor chips 120a and 120b, and the present disclosure is not limited in this respect. The semiconductor chips 120a and 120b are disposed on the package substrate 110. The top interposer 130 is electrically connected to the semiconductor chips 120a and 120b, and the semiconductor chips 120a and 120b are disposed between the package substrate 110 and the top interposer 130.

In this embodiment, the top interposer 130 interconnects the semiconductor chips 120a and 120b, such that the semiconductor chip 120a can be electrically connected to the semiconductor chip 120b through the top interposer 130. That is, the top interposer 130 provides a chip-to-chip connection between the semiconductor chips 120a and 120b. In this embodiment, a gap G is formed between the semiconductor chips 120a and 120b, and the gap G is at least partially disposed between the top interposer 130 and the package substrate 110.

At least one of the semiconductor chips 120a and 120b includes a semiconductor substrate 122 and a first electronic layer 124 formed in or on the semiconductor substrate 110. The semiconductor chips 120a and 120b can be attached to the package substrate 110 according to a variety of suitable configurations including, a flip-chip configuration, as depicted, or other configurations such as wire-bonding and the like. In the flip-chip configuration, the first electronic layers 124 of the semiconductor chips 120a and 120b are attached to the package substrate 110 using interconnect elements 140 such as bumps or other suitable connection elements. That is, the connection elements 140 are disposed between at least one of the semiconductor chips 120a and 120b and the package substrate 110 to interconnect the at least one semiconductor chip 120a or 120b and the package substrate 110. In FIGS. 1 and 2, some of the connection elements 140 are disposed between semiconductor chip 120a and the package substrate 110 and other connection elements 140 are disposed between the semiconductor chip 120b and the package substrate 110. In some other embodiments, the semiconductor chip 120a is electrically connected to the package substrate 110 while the semiconductor chip 120b is electrically isolated from the package substrate 110.

The semiconductor substrate 122 may be made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The first electronic layer 124 may include a plurality of microelectronic elements. Examples of the microelectronic elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form an integrated circuit, such as a logic device, memory device (e.g., SRAM), RF device, input/output (I/O) device, system-on-chip (SOC) device, system-in-chip (SIC) device, combinations thereof, and other suitable types of devices.

The at least one of the semiconductor chips 120a and 120b further includes a second electronic layer 126 formed in or on the semiconductor substrate 110 and opposite to the first electronic layer 124. That is, the semiconductor substrate 122 is disposed between the first electronic layer 124 and the second electronic layer 126. The second electronic layer 126 may include a plurality of microelectronic elements mentioned above or may be a redistribution layer. In some embodiments, the second electronic layer 126 can be electrically connected to the first electronic layer 124 through vias or external wiring configuration (not shown).

The top interposer 130 has a core 132 and a first trace layer 134. The first trace layer 134 may include a plurality of traces. The core 132 has a first surface 132a and a second surface 132b opposite to the first surface 132a. The first surface 132a faces the package substrate 110. The first trace layer 134 is disposed on the first surface 132a of the core 132. The first trace layer 134 interconnects the semiconductor chips 120a and 120b. In some embodiments, the first trace layer 132 is a redistribution layer or a logic device, and the present disclosure is not limited in this respect. In some embodiments, the core 132 of the top interposer 130 may be made of ceramic, organic material, glass, and/or semiconductor material or structure (such as silicon or silicon-on-insulator).

The semiconductor package further includes a plurality of connection elements 160 disposed between the top interposer 130 and the semiconductor chips 120a and 120b to interconnect the top interposer 130 and the semiconductor chips 120a and 120b. In some embodiments, the connection elements 160 can be bumps, which have smaller bonding area than the a bonding pad for a connecting wiring, such that the layout of the first electronic layer 134 can be denser, and the size of the top interposer 130 can be reduced. In some other embodiments, however, the connection elements 160 can be wirings or other suitable structures.

In FIGS. 1 and 2, the package substrate 110 may be a printed-circuit board, a ceramic, an organic, glass, and/or semiconductor material or structure), which provide a backplane with power, ground, control, monitoring, etc. The package substrate 110 may include electrical routing features configured to route electrical signals to or from the semiconductor chips 120a and/or 120b. In some embodiments, the package substrate 110 may include electrical routing features such as pads or trace layers (not shown) configured to receive the connection elements 140 and route electrical signals to or from the semiconductor chips 120a and/or 120b. A plurality of interconnects 150 such as, for example, solder balls, can be coupled to a surface of the package substrate 110 to further route the electrical signals to other electrical devices (e.g., motherboard or other chipset).

Although two semiconductor chips 120a and 120b and one top interposer 130 are depicted in connection with FIG. 1, other embodiments may include more semiconductor chips and top interposers 130 connected together in other possible configurations including three-dimensional configurations.

Figure 3:
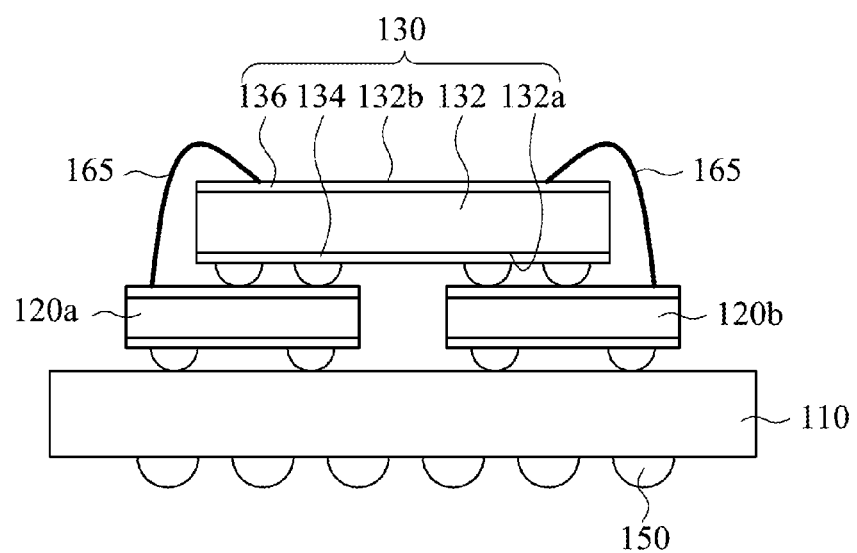
FIG. 3 is a side view of a semiconductor package according to some embodiments of the present disclosure.

FIG. 3 is a side view of a semiconductor package according to some embodiments of the present disclosure. The difference between the semiconductor packages of FIGS. 3 and 2 pertains to the presence of the connection elements 165. In FIG. 3, the top interposer 130 further includes a second trace layer 136 opposite to the first trace layer 134. That is, the second trace layer 136 is disposed on the second surface 132b of the core 132, and the core 132 is disposed between the first trace layer 134 and the second trace layer 136. The second trace layer 136 may include a plurality of traces. In some embodiments, the second trace layer 136 may be a redistribution layer or a logic device, and the present disclosure is not limited in this respect. The second trace layer 136 can be electrically connected to the semiconductor chip(s) 120a and/or 120b. For example, the semiconductor package may further include at least one connection element 165 (such as a wiring) interconnecting the second trace layer 136 and the semiconductor chip 120a or 120b. With a plurality of the connection elements 160, the semiconductor chips 120a and 120b can be connected to each other further through the second trace layer 136. Since the semiconductor chips 120a and 120b can be connected to each other through the first trace layer 134 and the second trace layer 136, the routing area of the first trace layer 134 and the second trace layer 136 can be reduced. Other relevant structural details of the semiconductor package of FIG. 3 are similar to the semiconductor package of FIG. 2, and, therefore, a description in this regard will not be repeated hereinafter.

Figure 4:
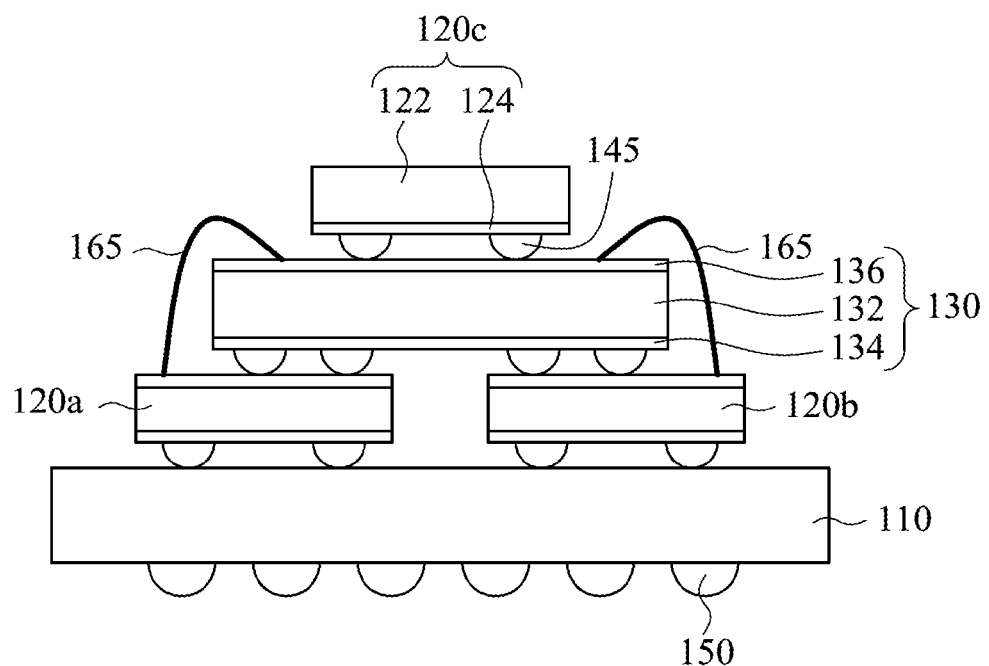
FIG. 4 is a side view of a semiconductor package according to some embodiments of the present disclosure.

FIG. 4 is a side view of a semiconductor package according to some embodiments of the present disclosure. The difference between the semiconductor packages of FIGS. 4 and 3 pertains to the presence of a semiconductor chip 120c. In FIG. 4, the semiconductor chip 120c is disposed on the top interposer 130. The semiconductor chip 120c can be a flip-chip configuration, and an electronic layer 124 of the semiconductor chip 120c is attached to the second trace layer 136 of the top interposer 130. Therefore, the semiconductor chip 120c can be electrically connected to the semiconductor chip 120a and/or 120b through the second trace layer 136. In some embodiments, connection elements 145 can be disposed between the semiconductor chip 120c and the top interposer 130 to interconnector the semiconductor chip 120c and the top interposer 130. The connection elements 145 can be bumps or some other suitable structures. Other relevant structural details of the semiconductor package of FIG. 4 are similar to the semiconductor package of FIG. 3, and, therefore, a description in this regard will not be repeated hereinafter.

Figure 5:
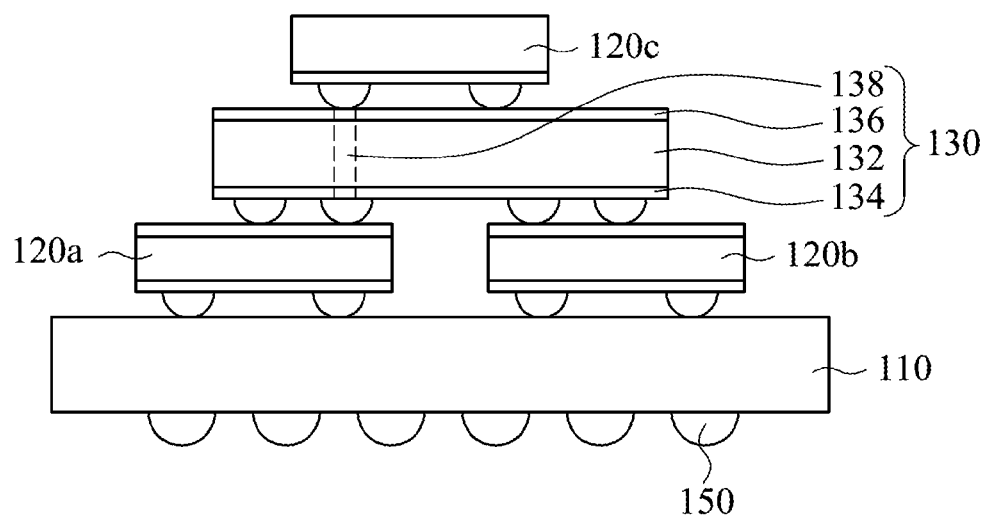
FIG. 5 is a side view of a semiconductor package according to some embodiments of the present disclosure.

FIG. 5 is a side view of a semiconductor package according to some embodiments of the present disclosure. The difference between the semiconductor packages of FIGS. 5 and 4 pertains to the configuration of the top interposer 130. In FIG. 5, the top interposer 130 further includes a via 138 interconnect the first trace layer 134 and the second trace layer 136. The via can be a through-die via (TDV), and if the core 132 of the top interposer 130 is made of silicon, the via is referred to as a through-silicon via (TSV). As such, the semiconductor chip 120c can be electrically connected to the semiconductor chip(s) 120a and/or 120b. In some embodiments, the connection elements 165 in FIG. 4 can be omitted. Other relevant structural details of the semiconductor package of FIG. 5 are similar to the semiconductor package of FIG. 4, and, therefore, a description in this regard will not be repeated hereinafter.

Figure 6:
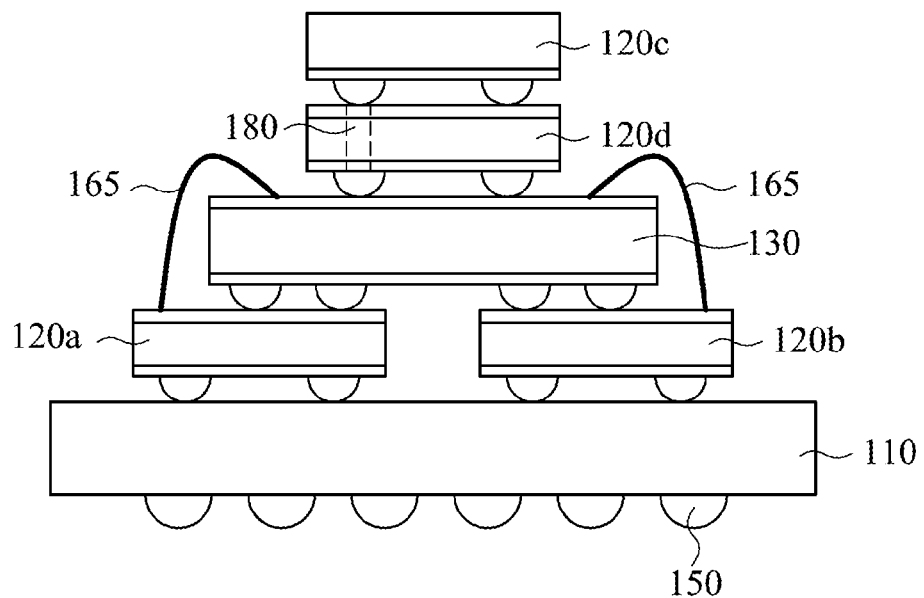
FIG. 6 is a side view of a semiconductor package according to some embodiments of the present disclosure.

FIG. 6 is a side view of a semiconductor package according to some embodiments of the present disclosure. The difference between the semiconductor packages of FIGS. 6 and 4 pertains to the presence of a semiconductor chip 120d. In FIG. 6, the semiconductor package further includes the semiconductor chip 120d disposed between the semiconductor chip 120c and the top interposer 130. The semiconductor chips 120c and 120d form a semiconductor chip stack. The semiconductor chip 120d is electrically connected to the top interposer 130. In some embodiments, semiconductor chip 120c is electrically connected to the semiconductor chip 120d. In some other embodiments, the semiconductor chip 120c is electrically connected to the top interposer 130 through a via 180 (such as a TDV and/or TSV) disposed in the semiconductor chip 120d or through a wiring (not shown) interconnecting the semiconductor chip 120c and the top interposer 130. In some other embodiments, the semiconductor chip stack formed on the top interposer 130 can include more than two semiconductor chips. In still some other embodiments, more than one semiconductor chip stack can be disposed on the top interposer 130 and interconnect to each other through the top interposer 130. With this configuration, the interconnection paths among the semiconductor chips can be reduced due to the presence of the top interposer 130, and the number of the vias 180 in the semiconductor chips can be reduced, which reduces the keep-out zones (KOZs) of the semiconductor chips. Other relevant structural details of the semiconductor package of FIG. 6 are similar to the semiconductor package of FIG. 4, and, therefore, a description in this regard will not be repeated hereinafter.

Figure 7:
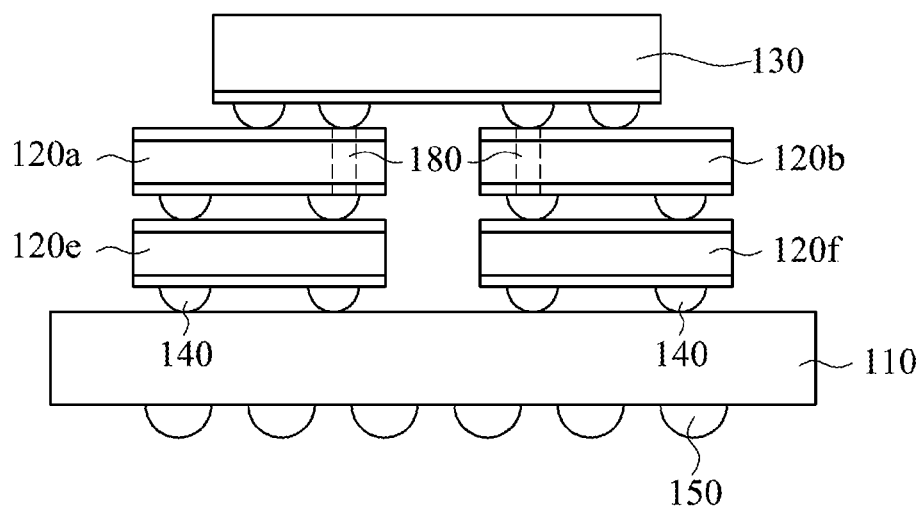
FIG. 7 is a side view of a semiconductor package according to some embodiments of the present disclosure.

FIG. 7 is a side view of a semiconductor package according to some embodiments of the present disclosure. The difference between the semiconductor packages of FIGS. 7 and 2 pertains to the presence of semiconductor chips 120e and 120f. In FIG. 7, the semiconductor chip 120e is disposed between the semiconductor chip 120a and the package substrate 110, such that the semiconductor chips 120a and 120e form a semiconductor chip stack. The semiconductor chip 120f is disposed between the semiconductor chip 120b and the package substrate 110, such that the semiconductor chips 120b and 120f form another semiconductor chip stack. The semiconductor chips 120e and 120f have similar configuration to the semiconductor chips 120a and 120b. The semiconductor chip stacks are disposed between the top interposer 130 and the package substrate 110. In some embodiments, the top interposer 130 can interconnect the semiconductor chips of the two semiconductor chip stacks. For example, the top interposer 130 can interconnect the semiconductor chips 120e and 120f through vias 180 respectively formed in the semiconductor chips 120a and 120b. In some other embodiments, the semiconductor chip 120a can be electrically connected to the semiconductor chip 120f through the top interposer 130 and the via 180 disposed in the semiconductor chip 120b, and the present disclosure is not limited in this respect. In some embodiments, the semiconductor chip 120c or the semiconductor chip stack of FIG. 6 can be disposed on the top interposer 130 and be electrically connected to other semiconductor chips according to actual requirements. Other relevant structural details of the semiconductor package of FIG. 7 are similar to the semiconductor package of FIG. 2, and, therefore, a description in this regard will not be repeated hereinafter.

Figure 8:
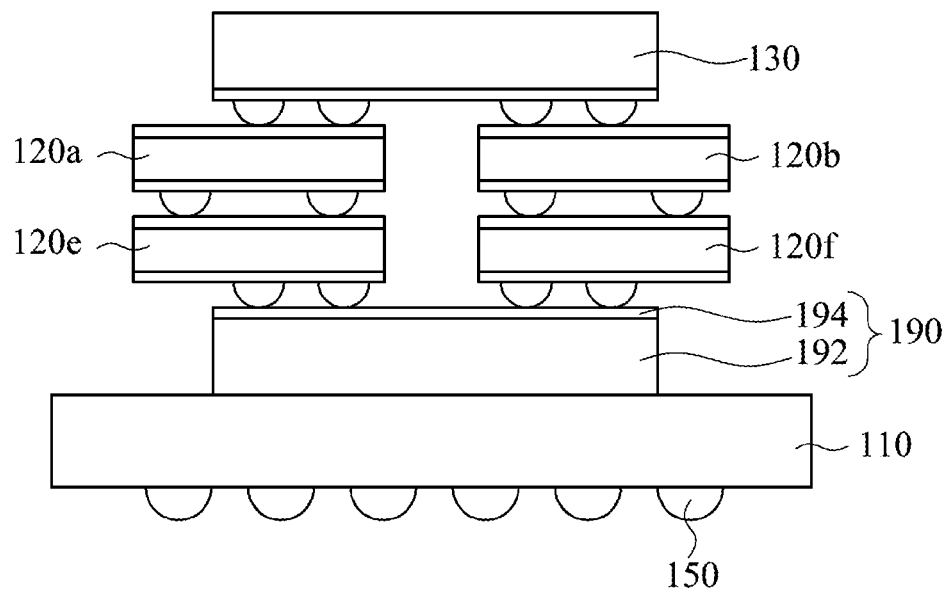
FIG. 8 is a side view of a semiconductor package according to some embodiments of the present disclosure.

FIG. 8 is a side view of a semiconductor package according to some embodiments of the present disclosure. The difference between the semiconductor packages of FIGS. 8 and 7 pertains to the presence of a bottom interposer 190. In FIG. 8, the semiconductor package further includes the bottom interposer 190 disposed between the semiconductor chips 120a and the package substrate 110 and between the semiconductor chips 120b and the package substrate 110. The bottom interposer 190 has a core 192 and a first trace layer 194 facing the semiconductor chips 120a, 120b, 120e, and 120d. The first trace layer 194 may include a plurality of traces. The first trace layer 194 interconnects at least two of the semiconductor chips 120a, 120b, 120e, and 120f. For example, the semiconductor chip 120a can be electrically connected to the semiconductor chip 120b through vias (not shown) in the semiconductor chips 120e and 120f and the bottom interposer 190. In some embodiments, the first trace layer 194 is a redistribution layer or a logic device, and the present disclosure is not limited in this respect. In some embodiments, the core 192 of the bottom interposer 190 may be made of ceramic, organic material, glass, and/or semiconductor material or structure (such as silicon or silicon-on-insulator). Other relevant structural details of the semiconductor package of FIG. 8 are similar to the semiconductor package of FIG. 7, and, therefore, a description in this regard will not be repeated hereinafter.

Figure 9:
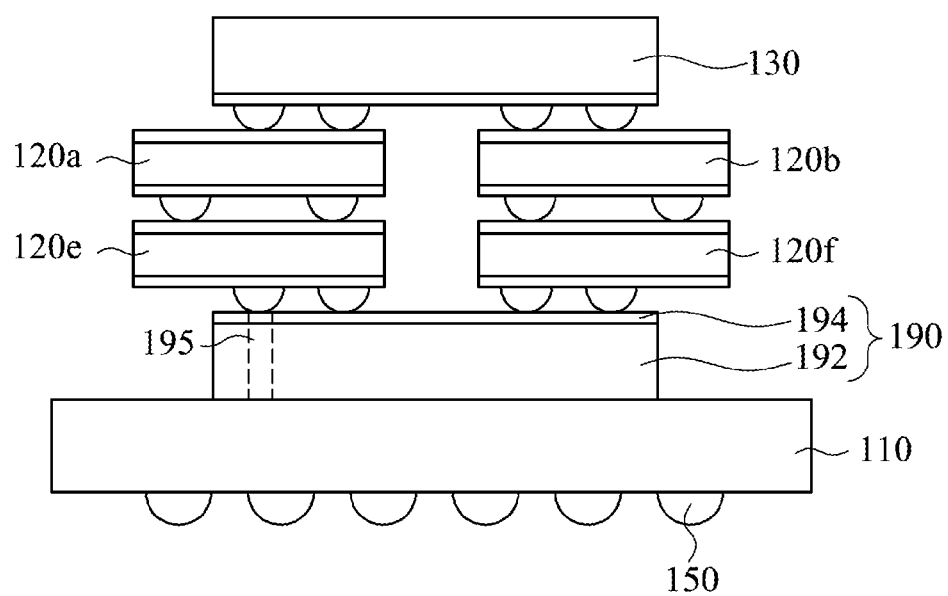
FIG. 9 is a side view of a semiconductor package according to some embodiments of the present disclosure.

FIG. 9 is a side view of a semiconductor package according to some embodiments of the present disclosure. The difference between the semiconductor packages of FIGS. 9 and 8 pertains to the presence of a via 195. In FIG. 9, the bottom interposer 190 further includes at least one via 195, and the via 195 interconnects at least one of the semiconductor chips 120a, 120b, 120f, and 120f and the package substrate 110. Other relevant structural details of the semiconductor package of FIG. 9 are similar to the semiconductor package of FIG. 8, and, therefore, a description in this regard will not be repeated hereinafter.

Figure 10A:
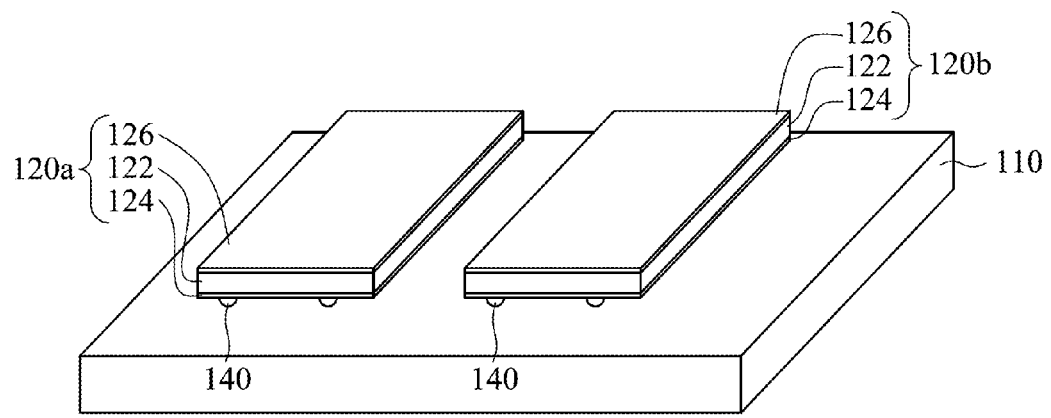
FIGS. 10A to 10D are perspective views of a method for manufacturing a semiconductor package at different stages according to some embodiments of the present disclosure.

The following provide a method for manufacturing a semiconductor package according to some embodiments. FIGS. 10A to 10D are perspective views of a method for manufacturing a semiconductor package at different stages according to some embodiments of the present disclosure, and FIG. 11 is a flow chart of a method for manufacturing a semiconductor package according to some embodiments of the present disclosure. In the following embodiments, the structural and material details described before are not repeated hereinafter, and only further information is supplied to perform the semiconductor package of FIGS. 10A-10D. Reference is made to FIG. 10A and FIG. 11. A package substrate 110 is provided. The package substrate 110 may be a printed-circuit board, a ceramic, an organic, glass, and/or semiconductor material or structure), which provide a backplane with power, ground, control, monitoring, etc.

In operation S12, a plurality of semiconductor chips are disposed (or attached or fixed or bonded) to the package substrate 110. For example, two semiconductor chips 120a and 120b are disposed on the package substrate 110. At least one of the semiconductor chips 120a and 120b includes a semiconductor substrate 122, a first electronic layer 124, and a second electronic layer 126. The semiconductor substrate 122 is disposed between the first electronic layer 124 and the second electronic layer 126. The first electronic layers 124 of the semiconductor chips 120a and 120b can be bonded to the package substrate 110 using interconnect elements 140. In some embodiments, the interconnect elements 140 can be bumps. In some embodiments, at least one of the semiconductor chips 120a and 120b further includes at least one via (TDV or TSV) to interconnect the first electronic layer 124 and the second electronic layer 126.

Figure 10B:
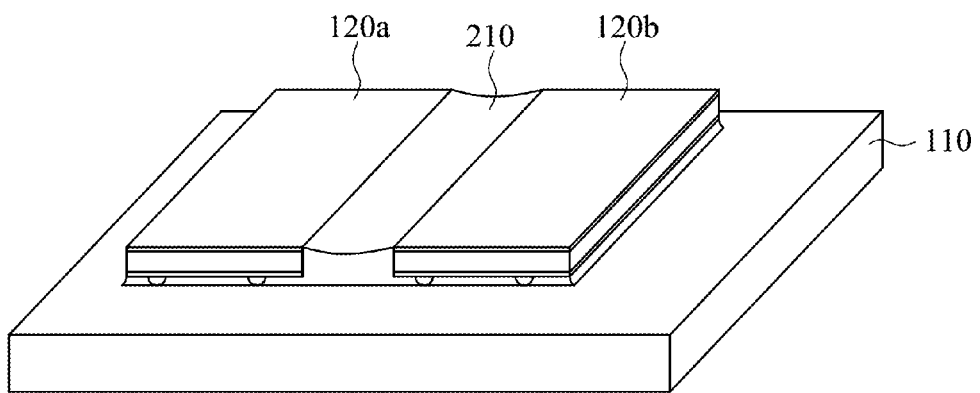
Figure 11:
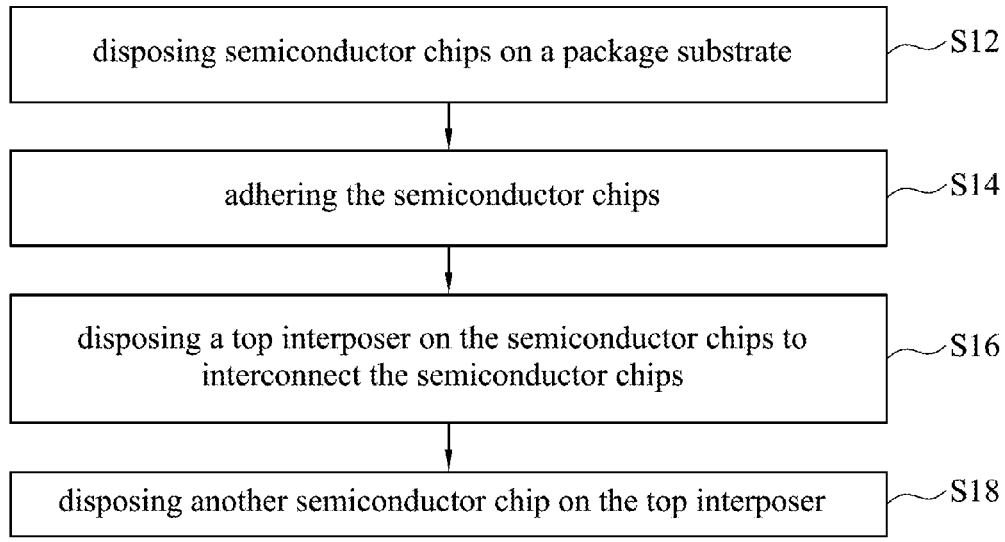
FIG. 11 is a flow chart of a method for manufacturing a semiconductor package according to some embodiments of the present disclosure.

Reference is made to FIGS. 10B and 11. In operation S14, the semiconductor chips 120a and 120b are adhered together. In some embodiments, the semiconductor chips 120a and 120b are adhered using an underfill (UF) dispenser 210, which results in a strong mechanical bond between the semiconductor chips 120a and 120b and the package substrate 110. In some embodiments, the underfill dispenser 210 may be made of epoxy resin or other suitable materials.

Figure 10C:
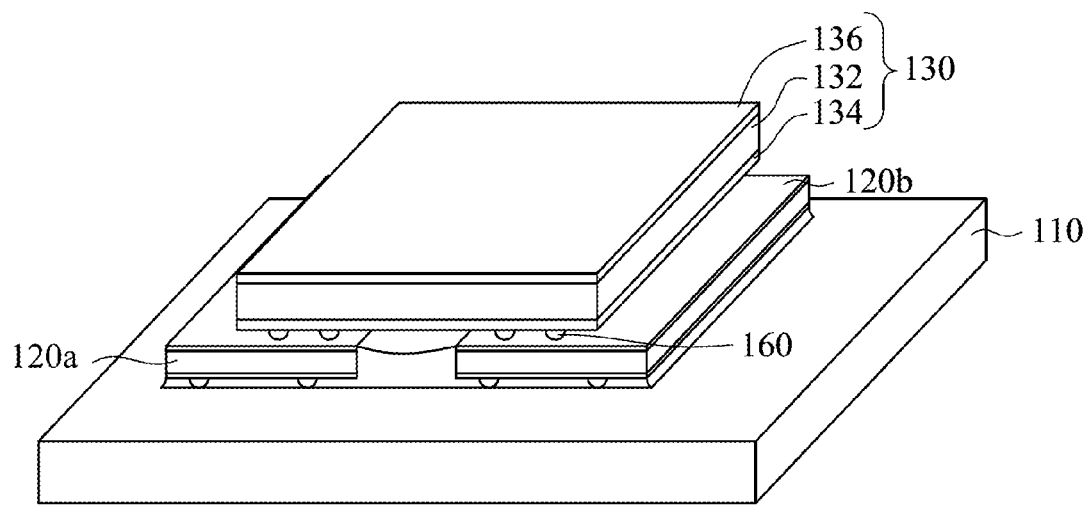

Reference is made to FIGS. 10C and 11. A top interposer 130 is disposed (or attached or fixed or bonded) on/to the semiconductor chips 120a and 120b, such that the top interposer 130 interconnects the semiconductor chips 120a and 120b. The top interposer 130 includes a core 132 and a first trace layer 134 formed on the core 132. The first trace layer 134 faces the semiconductor chips 120a and 120b. A plurality of connection elements 160 can be formed on the first trace layer 134 of the top interposer 130, and the top interposer 130 is then fixed on the semiconductor chips 120a and 120b through the connection elements 160. Alternatively, the connection elements 160 can be formed on the semiconductor chips 120a and 120b, and the top interposer 130 is then fixed on the semiconductor chips 120a and 120b through the connection elements 160. As such, the semiconductor package is formed.

Figure 10D:
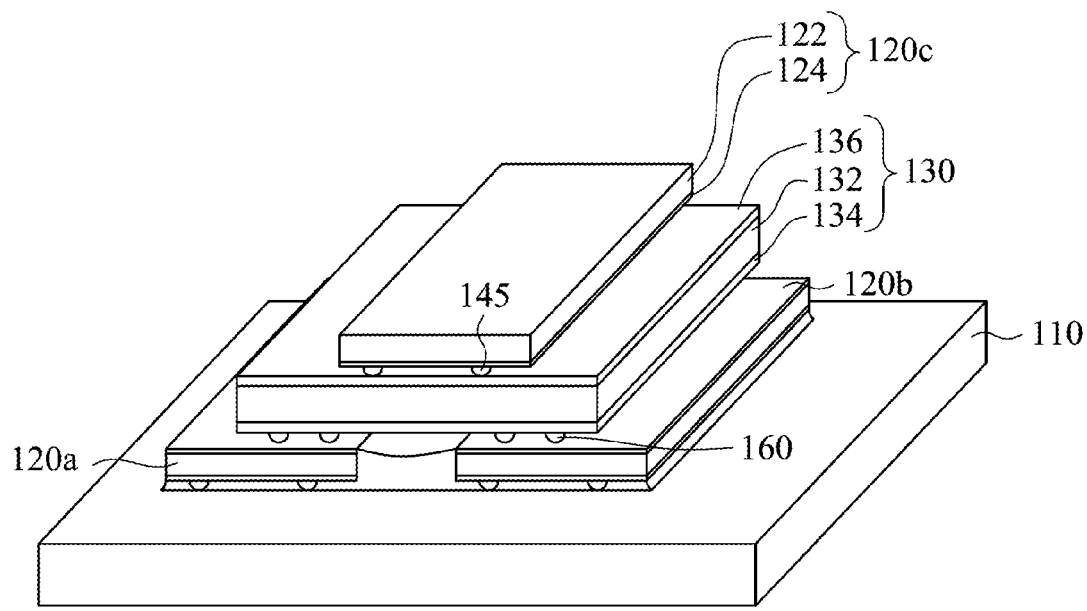

In some embodiments, the top interposer 130 further includes a second trace layer 136 disposed opposite to the first trace layer 134 if at least one semiconductor chip 120c is disposed (or attached or fixed or bonded) on/to the top interposer 130. The second trace layer 136 can be a route configuration to interconnect the semiconductor chip 120c and other elements (such as the semiconductor chips 120a and/or 120b). Reference is made to FIGS. 10D and 11. In operation S18, the semiconductor chip 120c is fixed on the top interposer 130, for example, through at least one connection element 145. The semiconductor chip 120c includes a semiconductor substrate 122 and a first electronic layer 124 disposed on the semiconductor substrate 122, and the first electronic layer 124 faces the top interposer 130.

Figure 12:
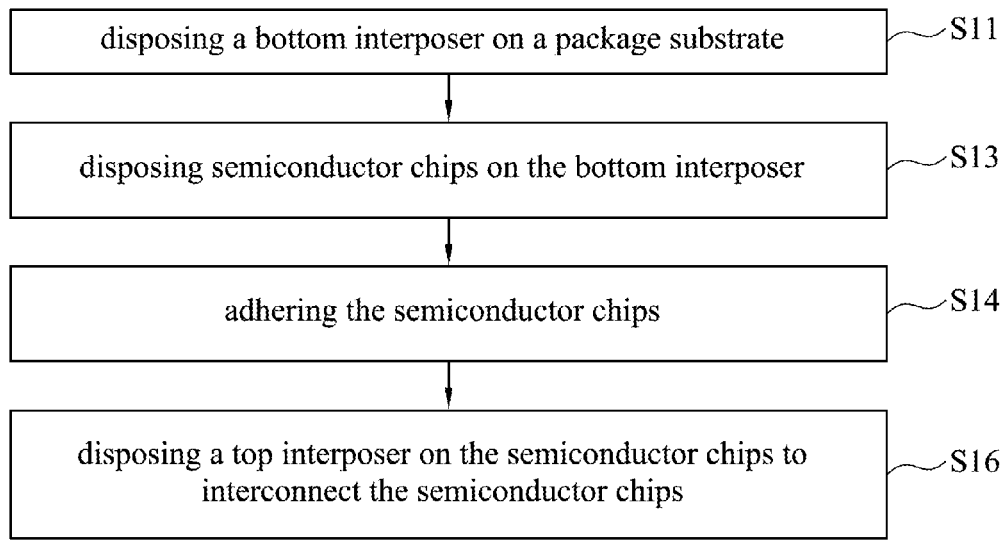
FIG. 12 is a flow chart of a method for manufacturing a semiconductor package according to some embodiments of the present disclosure.

FIG. 12 is a flow chart of a method for manufacturing a semiconductor package according to some embodiments of the present disclosure. In some embodiments, as shown in operation S11, a bottom interposer is disposed (or attached or fixed or bonded) on/to the package substrate. Subsequently, in operation S13, the semiconductor chips are fixed on the bottom interposers. The bottom interposer can interconnect the semiconductor chips. Following the operations S14 and S16, which are described in the foregoing paragraphs, and a description in this regard will not be repeated hereinafter.

Figure 13A:
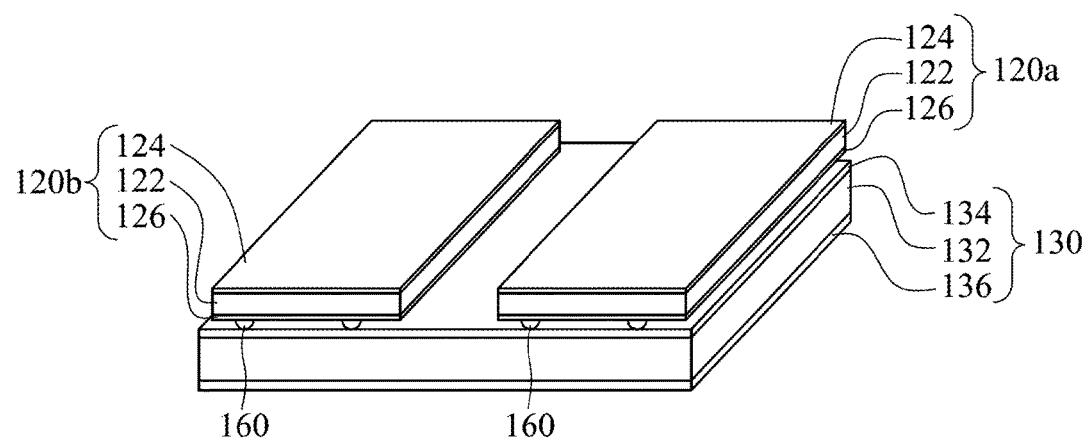
FIGS. 13A to 13D are perspective views of a method for manufacturing a semiconductor package at different stages according to some embodiments of the present disclosure.
Figure 13B:
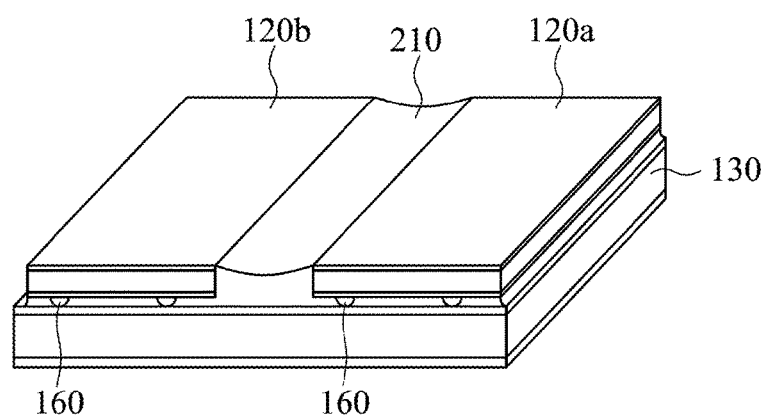
Figure 13C:
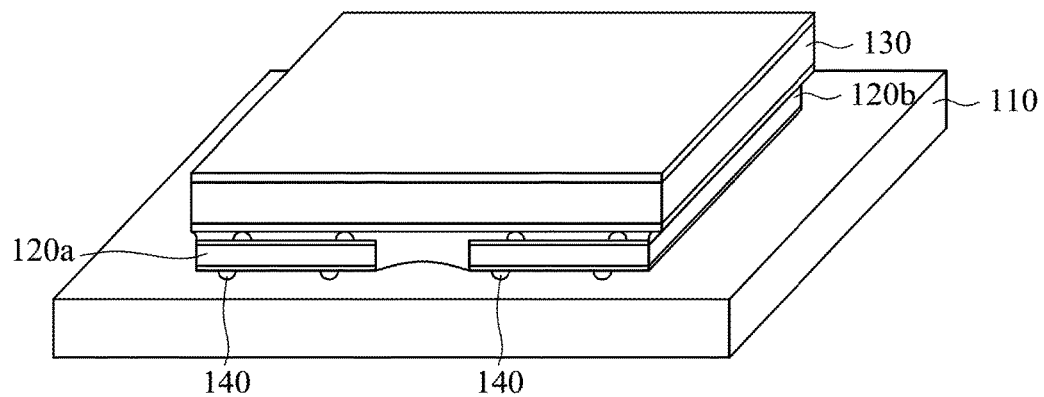
Figure 13D:
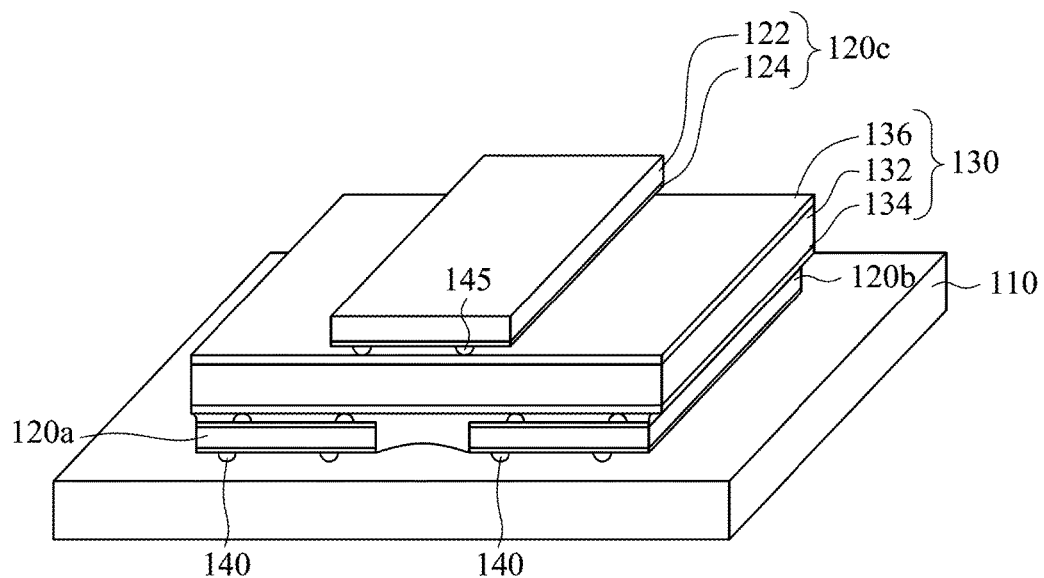
Figure 14:
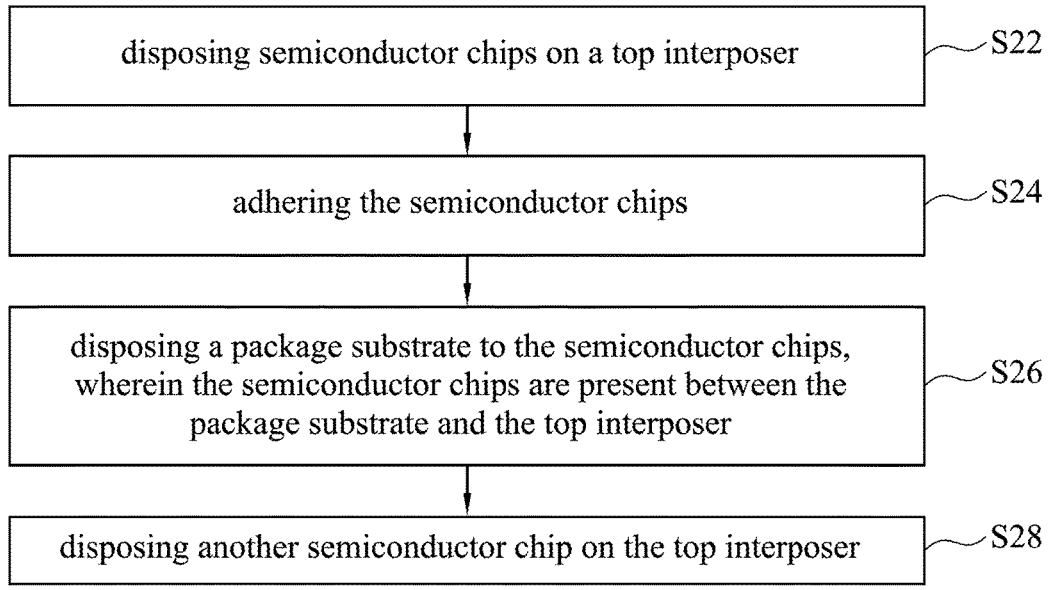
FIG. 14 is a flow chart of a method for manufacturing a semiconductor package according to some embodiments of the present disclosure.

FIGS. 13A to 13D are perspective views of a method for manufacturing a semiconductor package at different stages according to some embodiments of the present disclosure, and FIG. 14 is a flow chart of a method for manufacturing a semiconductor package according to some embodiments of the present disclosure. In the following embodiments, the structural and material details described before are not repeated hereinafter, and only further information is supplied to perform the semiconductor package of FIGS. 13A-13D. Reference is made to FIG. 13A and FIG. 14. A top interposer 130 is provided. The top interposer 130 includes a core 132 and a first trace layer 134 disposed on the core 132.

In operation S22, a plurality of semiconductor chips are disposed (or attached or fixed or bonded) on/to the top interposer 130. For example, two semiconductor chips 120a and 120b are fixed on the top interposer 130, such that the top interposer 130 interconnects the semiconductor chips 120a and 120b. The second electronic layers 126 of the semiconductor chips 120a and 120b can be bonded to first trace layer 134 of the top interposer 130 using connection elements 160. In some embodiments, the connection elements 160 can be bumps.

Reference is made to FIGS. 13B and 14. In operation S24, the semiconductor chips 120a and 120b are adhered together. In some embodiments, the semiconductor chips 120a and 120b are adhered using an underfill (UF) dispenser 210, which results in a strong mechanical bond between the semiconductor chips 120a and 120b and the package substrate 110. In some embodiments, the underfill dispenser 210 may be made of epoxy resin or other suitable materials.

Reference is made to FIGS. 13C and 14. A package substrate 110 is disposed (or attached or fixed or bonded) on/to the semiconductor chips 120a and 120b, such that the semiconductor chips 120a and 120b are disposed between the package substrate 110 and the top interposer 130. For example, the structure in FIG. 13B is flipped and fixed on the package substrate 110. A plurality of connection elements 140 can be formed on the package substrate 110, and the top package substrate 10 is then fixed on the semiconductor chips 120a and 120b through the connection elements 140. Alternatively, the connection elements 140 can be formed on the semiconductor chips 120a and 120b, and the package substrate 10 is then fixed on the semiconductor chips 120a and 120b through the connection elements 140. As such, the semiconductor package is formed.

In some embodiments, the top interposer 130 further includes a second trace layer 136 disposed opposite to the first trace layer 134 if at least one semiconductor chip 120c is disposed (or attached or fixed or bonded) on/to the top interposer 130. The second trace layer 136 can be a route configuration to interconnect the semiconductor chip 120c and other elements (such as the semiconductor chips 120a and/or 120b). Reference is made to FIGS. 13D and 14. In operation S28, the semiconductor chip 120c is fixed on the top interposer 130, for example, through at least one connection element 145. The semiconductor chip 120c includes a semiconductor substrate 122 and a first electronic layer 124 disposed on the semiconductor substrate 122, and the first electronic layer 124 faces the top interposer 130.

Figure 15:
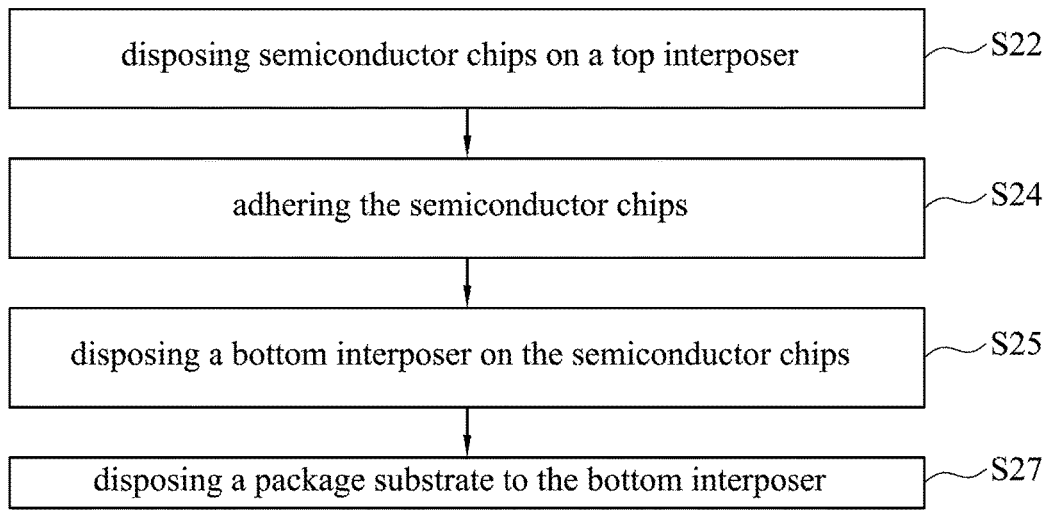
FIG. 15 is a flow chart of a method for manufacturing a semiconductor package according to some embodiments of the present disclosure.

FIG. 15 is a flow chart of a method for manufacturing a semiconductor package according to some embodiments of the present disclosure. In some embodiments, after the operation S24, a bottom interposer is fixed on the semiconductor chips, as shown in operation S25, such that the semiconductor chips are disposed between the top interposer and the bottom interposer. The bottom interposer can interconnect the semiconductor chips. Subsequently, in operation S27, the package substrate is fixed on the bottom interposers.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A semiconductor package comprising:
   a package substrate;
   a first semiconductor chip and a second semiconductor chip disposed on the package substrate;
   an underfill dispenser configured to mechanically bond the first semiconductor chip and the second semiconductor chip;
   a top interposer electrically connected to the first semiconductor chip and the second semiconductor chip, wherein the first semiconductor chip and the second semiconductor chip are disposed between the package substrate and the top interposer, and wherein there is an air gap between the underfill dispenser and the substrate or between the underfill dispenser and the top interposer;
   a first connection element disposed between the top interposer and the first semiconductor chip to electrically interconnect the top interposer and the first semiconductor chip; and
   a second connection element disposed between the top interposer and the second semiconductor chip to electrically interconnect the top interposer and the second semiconductor chip.

2. The semiconductor package of claim 1, further comprising at least one connection element disposed between the first semiconductor chip and the package substrate to interconnect the first semiconductor chip and the package substrate.

3. The semiconductor package of claim 1, wherein a gap is present between the first semiconductor chip and the second semiconductor chip, and the gap is at least partially present between the top interposer and the package substrate.

4. The semiconductor package of claim 1, wherein the top interposer comprises:
   a core having a first surface and a second surface opposite to the first surface, wherein the first surface faces the package substrate; and
   a first trace layer disposed on the first surface, wherein the first trace layer electrically interconnects the first semiconductor chip and the second semiconductor chip.

5. The semiconductor package of claim 4, wherein the top interposer further comprises a second trace layer disposed on the second surface.

6. The semiconductor package of claim 5, wherein the second trace layer is electrically connected to the first semiconductor chip.

7. The semiconductor package of claim 1, further comprising a third semiconductor chip disposed on the top interposer.

8. The semiconductor package of claim 7, wherein the third semiconductor chip is electrically connected to the top interposer.

9. The semiconductor package of claim 7, wherein the top interposer comprises a via therein to interconnect the first semiconductor chip and the third semiconductor chip.

10. The semiconductor package of claim 7, further comprising a fourth semiconductor chip electrically connected to the third semiconductor chip, wherein the third semiconductor chip is disposed between the fourth semiconductor chip and the top interposer.

11. The semiconductor package of claim 8, further comprising a fourth semiconductor chip disposed between the third semiconductor chip and the top interposer, wherein the fourth semiconductor chip comprises a via therein to interconnect the third semiconductor chip and the top interposer.

12. The semiconductor package of claim 1, further comprising a third semiconductor chip disposed between the first semiconductor chip and the package substrate.

13. The semiconductor package of claim 1, further comprising a bottom interposer disposed between the first semiconductor chip and the package substrate.

14. The semiconductor package of claim 13, wherein the bottom interposer is electrically connected to the first semiconductor chip and the second semiconductor chip.

15. The semiconductor package of claim 13, wherein the bottom interposer comprises a via therein to interconnect the first semiconductor chip and the package substrate.

16. A method for manufacturing a semiconductor package comprising:
- disposing a first semiconductor chip and a second semiconductor chip on a package substrate;
- adhering the first semiconductor chip and the second semiconductor chip by an underfill dispenser to achieve a mechanical bond between the first semiconductor chip and the second semiconductor chip; and
- disposing a top interposer on the first semiconductor chip and the second semiconductor chip to electrically interconnect the first semiconductor chip and the second semiconductor chip, and wherein there is an air gap between the underfill dispenser and the top interposer, wherein disposing the top interposer comprises:
  - forming a first connection element between the top interposer and the first semiconductor chip to electrically interconnect the top interposer and the first semiconductor chip; and
  - forming a second connection element between the top interposer and the first semiconductor chip to electrically interconnect the top interposer and the second semiconductor chip,
- the first semiconductor chip and the second semiconductor chip are disposed between the top interposer and the package substrate.

17. The method of claim 16, further comprising disposing a bottom interposer on the package substrate, wherein the first semiconductor chip and the second semiconductor chip are disposed on the bottom interposer and between the top interposer and the bottom interposer.

18. The method of claim 16, further comprising disposing a third semiconductor chip on the top interposer.

19. A method for manufacturing a semiconductor package comprising:
- disposing a first semiconductor chip and a second semiconductor chip on a top interposer to electrically interconnect the first semiconductor chip and the second semiconductor chip, wherein disposing the first semiconductor chip and the second semiconductor chip comprises:
  - forming a first connection element between the top interposer and the first semiconductor chip to electrically interconnect the top interposer and the first semiconductor chip; and
  - forming a second connection element between the top interposer and the first semiconductor chip to electrically interconnect the top interposer and the second semiconductor chip;
- adhering the first semiconductor chip and the second semiconductor chip by an underfill dispenser to achieve a mechanical bond between the first semiconductor chip and the second semiconductor chip; and
- disposing a package substrate to the first semiconductor chip and the second semiconductor chip, and wherein there is an air gap between the underfill dispenser and the package substrate, wherein the first semiconductor chip and the second semiconductor chip are present between the package substrate and the top interposer.

20. The method of claim 19, further comprising disposing a bottom interposer on the first semiconductor chip and the second semiconductor chip, wherein the first semiconductor chip and the second semiconductor chip are disposed between the bottom interposer and the top interposer.

* * * * *